United States Patent
Mahoney et al.

(10) Patent No.: US 9,184,083 B2
(45) Date of Patent: Nov. 10, 2015

(54) APPARATUS, HYBRID LAMINATED BODY, METHOD AND MATERIALS FOR TEMPORARY SUBSTRATE SUPPORT

(71) Applicant: 3M INNOVATIVE PROPERTIES COMPANY, St. Paul, MN (US)

(72) Inventors: Wayne S. Mahoney, St. Paul, MN (US); Rajdeep S. Kalgutkar, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 13/953,348

(22) Filed: Jul. 29, 2013

(65) Prior Publication Data

US 2015/0031215 A1    Jan. 29, 2015

(51) Int. Cl.
*H01L 21/00*   (2006.01)
*H01L 21/683*  (2006.01)
*H01L 21/304*  (2006.01)

(52) U.S. Cl.
CPC .......... *H01L 21/6836* (2013.01); *H01L 21/304* (2013.01); *H01L 21/6835* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01); *Y10T 428/31623* (2015.04)

(58) Field of Classification Search
CPC .................................................. H01L 21/6836
USPC ................................................ 438/464, 759
See application file for complete search history.

(56) References Cited

U.S. PATENT DOCUMENTS

| | | |
|---|---|---|
| 2,793,219 A | 5/1957 | Barrett |
| 2,955,121 A | 10/1960 | Myers |
| 3,377,303 A | 4/1968 | Peerman |
| 5,507,464 A | 4/1996 | Hamerski |
| 5,807,968 A | 9/1998 | Heinrich |
| 6,162,534 A | 12/2000 | Hamerski |
| 6,221,454 B1 | 4/2001 | Saito |
| 6,410,135 B1 | 6/2002 | Hamerski |
| 6,541,089 B1 | 4/2003 | Hamerski |
| 6,821,619 B2 | 11/2004 | Hamerski |
| 7,534,498 B2 | 5/2009 | Noda |
| 2008/0280422 A1* | 11/2008 | Shin et al. ............. 438/464 |
| 2011/0139206 A1 | 6/2011 | Ukita |
| 2011/0297771 A1* | 12/2011 | Noda et al. ............. 241/65 |
| 2012/0153335 A1* | 6/2012 | Matsushita et al. ..... 257/98 |
| 2013/0084459 A1 | 4/2013 | Larson |

FOREIGN PATENT DOCUMENTS

JP    6-302569    10/1994

* cited by examiner

*Primary Examiner* — Charles Garber
*Assistant Examiner* — Evren Seven
(74) *Attorney, Agent, or Firm* — Adam Bramwell; Ann Gallagher (57) ABSTRACT

A hybrid laminated body is provided that includes a light-transmitting support, a latent release layer disposed upon the light-transmitting support, a joining layer disposed upon the latent release layer, and a polyamide thermoplastic priming layer disposed upon the joining layer. The hybrid laminated body can further include a substrate to be processed such as, for example, a silicon wafer to be ground. Also provided is a method for manufacturing the provided laminated body.

16 Claims, 5 Drawing Sheets

APPARATUS, HYBRID LAMINATED BODY, METHOD AND MATERIALS FOR TEMPORARY SUBSTRATE SUPPORT

FIELD

The present disclosure relates to temporary substrate support during processing.

BACKGROUND

In various fields, temporarily fixing a substrate to a support can enable or improve processing. As an example, reducing the thickness of a substrate often is critical. Particularly, in the semiconductor industry, efforts to further reduce the thickness of a semiconductor wafer are in progress to respond to the goal of reducing the thickness of semiconductor packages as well as for high-density fabrication by chip lamination technology. Thickness reduction is performed by so-called back side grinding of a semiconductor wafer on the surface opposite that containing pattern-formed circuitry. Usually, in conventional techniques of grinding the back side, or surface, of a wafer and conveying it while holding the wafer with only a backgrinding protective tape, thickness reduction can be accomplished in practice only to a thickness of about 150 micrometers ($\mu$m) because of problems such as uneven thickness of the ground wafer or warping of the wafer with protective tape after grinding. For example, Japanese Unexamined Patent Publication (Kokai) No. 6-302569 discloses a method where a wafer is held on a ring-form frame through a pressure-sensitive acrylate adhesive tape, the back surface of this wafer held on the frame is ground and the wafer is conveyed to the next step. However, this method has not yet attained a remarkable improvement over the present level of wafer thickness that may be obtained without encountering the aforementioned problems of unevenness or warping.

A method of grinding the back surface of a wafer and conveying it while firmly fixing the wafer on a hard support through an acrylate adhesive agent has also been proposed. This tends to prevent the breakage of a wafer during the back surface grinding and conveyance by supporting the wafer using such a support. According to this method, a wafer can be processed to a lower thickness level as compared with the above-described method; however, the thin wafer cannot be separated from the support without breaking the wafer and therefore, this method may be practically used as a method of thinning a semiconductor wafer.

SUMMARY

Thus, there is a need for methods and materials for temporary substrate support during processes such as, for example, backside grinding of silicon wafers, that can overcome the problems with debonding and also can offer good support to the wafer during processing. There is a need to provide temporary substrate support that may include either inorganic or organic coatings so that the substrate can be easily removed from the support after processing without leaving a residue. There is also a need for a process that enables high throughput debonding without imparting unneeded stress on the substrate surface topography like bumps and posts.

In one aspect, a laminated body or laminate is provided that includes a light-transmitting support, a latent release layer disposed upon the light-transmitting support, a joining layer disposed upon the latent release layer, and a polyamide thermoplastic priming layer disposed upon the joining layer. In some embodiments, the support can include glass. In some embodiments, the latent release layer can include a photothermal conversion layer that can be activated upon exposure to actinic radiation such as that from a laser or laser diode. In some embodiments, the photothermal conversion layer can include transparent filler such as, for example, silica. In some embodiments, the joining layer can be a thermosetting adhesive, which can be acrylic. The provided laminated body can further include a substrate to be processed in contact with the polyamide thermoplastic priming layer. In some embodiments, the substrate to be processed can include a silicon wafer.

In another aspect, a method for manufacturing the laminate body is provided that includes coating the polyamide thermoplastic priming layer onto the substrate, optionally, drying the polyamide thermoplastic priming layer if the coating includes a solvent, coating the joining layer onto the polyamide thermoplastic priming layer; optionally, curing the joining layer, coating the latent release layer upon the light-transmitting support, and laminating a light-transmitting support to the joining layer. The coating of the polyamide thermoplastic priming layer or the joining layer can include spin coating, spray coating, dip coating, screen printing, die coating, or knife coating.

In another aspect, the method for manufacturing the laminated body further includes processing the substrate, irradiating the photothermal conversion layer through the light-transmitting support to decompose the photothermal conversion layer and thereby to separate the substrate and the light-transmitting support, peeling the joining layer from the substrate, and removing the polyamide thermoplastic priming layer from the substrate. The polyamide thermoplastic priming layer can be removed by washing the thermoplastic priming layer with solvent.

In the present disclosure:

"actinic radiation" refers to any electromagnetic radiation that can produce photochemical reactions and includes ultraviolet, visible, and infrared radiation;

"light-transmitting support" refers to a material that can allow significant amounts (enough to cause a photochemical reaction) of actinic radiation to be transmitted through it "latent release layer" refers to a layer that binds two materials together but can, when exposed to an external stimulus, lose adhesiveness to one or the other materials;

"thermoplastic" refers to a polymer that reversibly turns liquid when heated and freezes to a very glassy state when cooled; and "thermoset" or "thermosetting" refers to a polymeric material that irreversibly cures.

The provided laminate body and method of making the same provides for substrate support during operations such as, for example, backside grinding of silicon wafers. The use of a thermoplastic priming layer provides support for substrates that have varying chemistries in that it provides a consistent layer for removal of the joining layer. Furthermore, the provided laminate body can enable high throughput debonding without imparting unneeded stress on the substrate. This is particularly important when the substrate is a thin wafer.

The above summary is not intended to describe each disclosed embodiment of every implementation of the present invention. The brief description of the drawings and the detailed description which follows more particularly exemplify illustrative embodiments.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Figure 1:
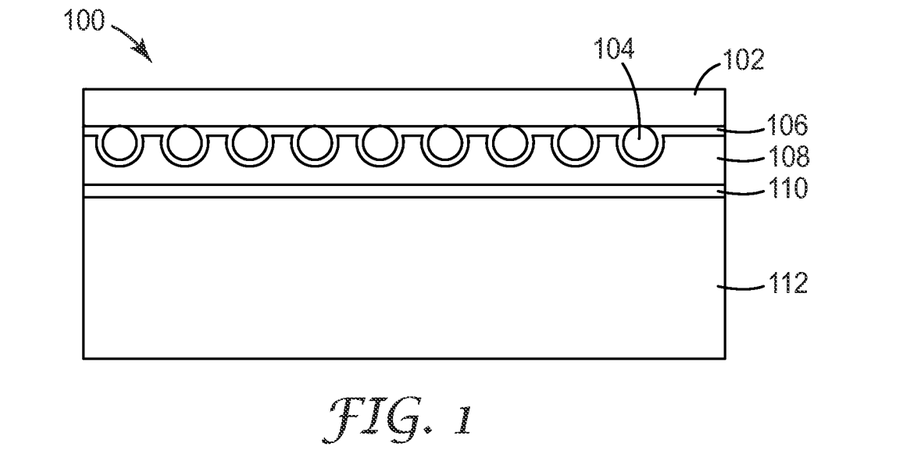
FIG. 1 is a side-view cross section of an embodiment of a provided laminate.

FIG. 1 is a side-view cross-sectional illustration of an embodiment of a provided laminated body 100. Laminated body 100 includes substrate 102 which may include solder balls or bumps 104 of the substrate to be ground is a silicon wafer or semiconductor wafer. Thermoplastic priming layer 106 is disposed on the circuit side (solder bump side) of wafer 102 and may encapsulate solder bumps 104 as shown in FIG. 1. Joining layer 108 is in contact with thermoplastic priming layer 106 and is disposed between thermoplastic priming layer 106 and latent release layer 110. Latent release layer 110 is disposed upon light-transmitting support 112.

Figure 2:
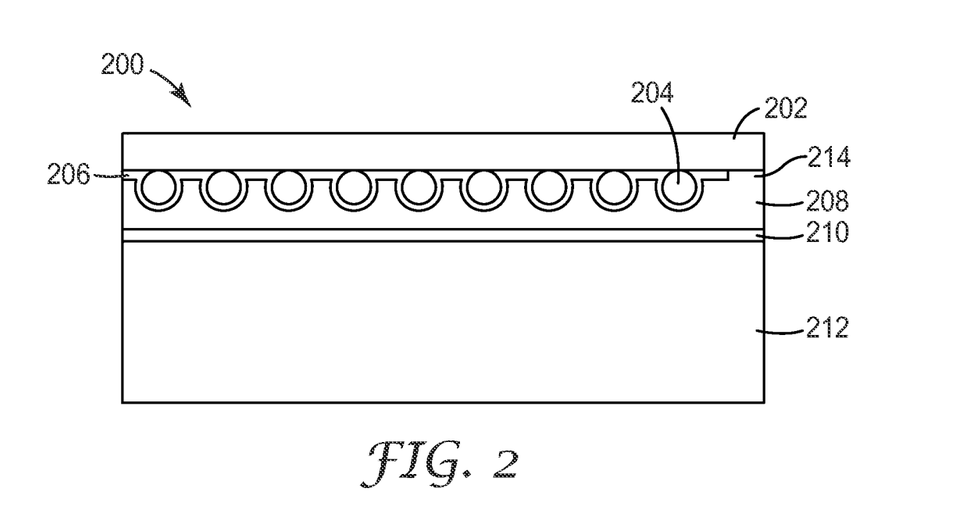
FIG. 2 is a side-view cross section of another embodiment of a provided laminate.

FIG. 2 is a side-view cross-sectional illustration of another embodiment of a provided laminated body 200. Laminated body 200 includes substrate 202 which may include solder balls or bumps 204 if the substrate is a silicon wafer or semiconductor wafer. Thermoplastic priming layer 206 is disposed on the circuit side (solder bump side) of wafer 202 and may encapsulate solder bumps 204 as shown in FIG. 2. Joining layer 208 is in contact with thermoplastic priming layer 206 and is disposed between thermoplastic priming layer 206 and latent release layer 210. Latent release layer 210 is disposed upon light-transmitting support 212. Thermoplastic edge removal area 214 affords protection from solubilizing process chemistries and is formed by removing thermoplastic priming layer 206 at the edge of substrate 202 and overcoating with thermally stable joining layer 208.

The laminated body includes a light-transmitting support. The light-transmitting support is a material capable of transmitting actinic radiation energy, such as that from a laser or laser diode. The light transmittance of the support is not limited as long as it does not prevent the transmittance of a practical intensity level of radiation energy into the latent release layer to enable the decomposition of the latent release layer if the latent release layer is light-activated. However, the transmittance is typically, for example, 50% or more. The light-transmitting support typically has a sufficiently high stiffness and the flexural rigidity of the support is typically $2\times10^{-3}$ (Pa·m$^3$) or more, more typically $3\times10^{-2}$ (Pa·m$^3$) or more. Examples of useful supports include glass plates and acrylic plates. Furthermore, in order to enhance the adhesive strength to an adjacent layer such as latent release layer, the support may be surface-treated with a silane coupling agent or the like, if desired. In the case of using a UV-curable photothermal conversion layer or joining layer, the support typically transmits ultraviolet radiation.

The support can be exposed to heat generated in the latent release layer, if the latent release layer is photo-activated, when the photothermal conversion layer is irradiated. A support having heat resistance, chemical resistance and a low expansion coefficient can be used in the provided laminate body. Examples of support materials having these properties include borosilicate glass available as PYREX and TEMPAX and alkaline earth boro-aluminosilicate glass such as CORNING Eagle XG.

The provided laminated body includes a latent release layer disposed upon the light-transmitting support. The latent release layer includes a material or combination of materials that undergo a decrease in adhesion in response to an external stimulus. The external stimulus can be heating or cooling, exposure to actinic radiation, strain, exposure to a chemical agent such as moisture, acid, or base. In one embodiment, the latent release layer can be a thermoplastic material that has a glass transition temperature, $T_g$, that is below the use temperature of the laminated body. When release is desired, the temperature of the laminated body is reduced below the $T_g$ of the latent release layer so as to cause the latent release layer to lose adhesion. In other embodiments, the latent release layer can include a material that releases upon application of a strain such as that disclosed, for example, in U.S. Pat. Nos. 5,507,464; 6,162,534; 6,410,135; 6,541,089; and 6,821,619 (all Hamerski or Hamerski et al.). In some embodiments, the latent release layer can be a thermoplastic material that can be crosslinked, for example, by application of actinic radiation or heat to generate a catalyst, such as an acid catalyst, which can initiate cross-linking which, in turn, can decrease adhesion of the latent release layer. Exemplary catalysts can include photoacid-generators, latent heat acid generators, or other latent catalysts which are well known to those of ordinary skill in the art. In some embodiments the latent release layer can be a photothermal conversion layer.

A photothermal conversion layer contains a light-absorbing agent and a heat decomposable resin. Radiation energy applied to the photothermal conversion layer in the form of a laser beam or the like is absorbed by the light-absorbing agent and converted into heat energy. The heat energy generated abruptly elevates the temperature of the photothermal conversion layer and the temperature reaches the thermal decomposition temperature of the heat decomposable resin (organic component) in the photothermal conversion layer resulting in heat decomposition of the resin. The gas generated by the heat decomposition is believed to form a void layer (such as air space) in the photothermal conversion layer and divide the photothermal conversion layer into two parts, whereby the support and any substrate attached to the laminated body can be separated. Suitable photothermal conversion layers are described, for example, in U.S. Pat. No. 7,534,498 (Noda et al.).

The light-absorbing agent can absorb actinic radiation at the wavelength used. The radiation energy is usually a laser beam having a wavelength of 300 to 11,000 nanometers (nm), typically 300 to 2,000 nm and specific examples thereof include a YAG laser which emits light at a wavelength of 1,064 nm, a second harmonic generation YAG laser at a wavelength of 532 nm, and a semiconductor laser at a wavelength of 780 to 1,300 nm. Although the light-absorbing agent varies depending on the wavelength of the laser beam, examples of the light-absorbing agent which can be used include carbon black, graphite powder, microparticle metal powders such as iron, aluminum, copper, nickel, cobalt, manganese, chromium, zinc and tellurium, metal oxide powders such as black titanium oxide, and dyes and pigments such as an aromatic diamino-based metal complex, an aliphatic diamine-based metal complex, an aromatic dithiol-base metal complex, a mercaptophenol-based metal complex, a squarylium-based compound, a cyanine-based dye, a methine-based dye, a naphthoquinone-based dye and an anthraquinone-based dye. The light-absorbing agent may be in the form of a film including a vapor deposited metal film. Among these light-absorbing agents, carbon black is particularly useful, because the carbon black significantly decreases the force necessary for separating the substrate from the support after the irradiation and accelerates the separation.

The concentration of the light-absorbing agent in the photothermal conversion layer varies depending on the kind, particle state (structure) and dispersion degree of the light-absorbing agent but the concentration is usually from 5 volume percent (vol %) to 70 vol % in the case of general carbon black having a particle size of approximately from 5 nm to 500 nm. If the concentration is less than 5 vol %, heat generation of the photothermal conversion layer may be insufficient for the decomposition of the heat decomposable resin, whereas if it exceeds 70 vol %, the photothermal conversion layer becomes poor in the film-forming property and may readily cause failure of adhesion to other layers. In the case where the adhesive used as the joining layer is a UV-curable adhesive, if the amount of carbon black is excessively large, the transmittance of the ultraviolet ray for curing the adhesive decreases. Therefore, in the case of using a UV-curable adhesive as the joining layer, the amount of carbon black should be 60 vol % or less. In order to reduce the force at the time of removing the support after irradiation and thereby prevent abrasion of the photothermal conversion layer during grinding (such as abrasion due to abrasive in wash water), carbon black is typically contained in the photothermal conversion layer in an amount of 20 vol % to 60 vol %, more typically from 35 vol % to 55 vol %.

Examples of heat decomposable resin which can be used include gelatin, cellulose, cellulose ester (e.g., cellulose acetate, nitrocellulose), polyphenol, polyvinyl butyral, polyvinyl acetal, polycarbonate, polyurethane, polyester, polyorthoester, polyacetal, polyvinyl alcohol, polyvinylpyrrolidone, a copolymer of vinylidene chloride and acrylonitrile, poly(meth)acrylate, polyvinyl chloride, silicone resin and a block copolymer comprising a polyurethane unit. These resins can be used individually or in combination of two or more thereof. The glass transition temperature ($T_g$) of the resin is typically room temperature (20° C.) or more so as to prevent the re-adhesion of the photothermal conversion layer once it is separated due to the formation of a void layer as a result of the thermal decomposition of the heat decomposable resin, and the Tg is more typically 100° C. or more so as to prevent the re-adhesion. In the case where the light-transmitting support is glass, in order to increase the adhesive force between the glass and the photothermal conversion layer, a heat decomposable resin having within the molecule a polar group (e.g., —COOH, —OH) capable of hydrogen-bonding to the silanol group on the glass surface can be used. Furthermore, in applications requiring a chemical solution treatment such as chemical etching, in order to impart chemical resistance to the photothermal conversion layer, a heat decomposable resin having within the molecule a functional group capable of self-crosslinking upon heat treatment, a heat decomposable resin capable of being crosslinked by ultraviolet or visible light, or a precursor thereof (e.g., a mixture of monomers and/or oligomers) may be used. For forming the photothermal conversion layer as a pressure-sensitive adhesive photothermal conversion layer a pressure-sensitive adhesive polymer formed from poly(meth)acrylate or the like, as may be used for the heat decomposable resin, can be employed.

The photothermal conversion layer may contain transparent filler, if desired. The transparent filler acts to prevent the re-adhesion of the photothermal conversion layer once it is separated due to the formation of a void layer as a result of the thermal decomposition of the heat decomposable resin. Therefore, the force required for the separation of the substrate and the support, after grinding of the substrate and subsequent irradiation, can be further reduced. Furthermore, since the re-adhesion can be prevented, the latitude in the selection of the heat decomposable resin is broadened. Examples of the transparent filler include silica, talc and barium sulfate. Use of the transparent filler is particularly advantageous when a UV-curable adhesive is used as the joining layer. This is presently believed to be due to the following reasons. When a particulate light-absorbing agent such as carbon black is used, the light-absorbing agent has a function of reducing the force for separation and also functions to disrupt the transmittance of ultraviolet light. Therefore, when a UV-curable adhesive is used as the joining layer, the curing may not proceed satisfactorily or may require a very long time. In such a case, when transparent filler is used, the substrate and the support can be separated easily after irradiation without disturbing the curing of the UV-curable adhesive. The amount of the transparent filler can be determined, when a particulate light-absorbing agent such as carbon black is used, by the total amount with the light-absorbing agent. The total amount of the particulate light-absorbing agent (e.g., carbon black) and the transparent filler in the photothermal conversion layer is typically from 5 vol % to 70 vol % based on the volume of the photothermal conversion layer. With the total amount in this range, the force for the separation of the substrate and the support can be sufficiently reduced. However, the force for the separation is also affected by the shape of the particulate light-absorbing agent and the transparent filler. More specifically, the force for the separation is sometimes more effectively reduced with a small filler amount in the case where the particle shape is complicated (a particle state resulting from more complex structure) than in the case where the particle shape is relatively simple, such as nearly spherical.

The total amount of the particulate light-absorbing agent and the transparent filler can be determined based upon the "top filler volume concentration" (TFVC) in some cases. This means a filler volume concentration such that when a mixture of the particulate absorbing agent and the transparent filler is left standing in a dry state and the heat decomposable resin is mixed with the filler in an amount of just filling the volume of voids. That is, the TFVC when the heat decomposable resin is mixed with the filler in an amount of just filling the volume of voids in the mixture of the particulate light-absorbing agent and the transparent filler is 100% of the top filler volume concentration. The total amount of the particulate light-absorbing agent and the transparent filler in the photothermal conversion layer is typically 80% or more, more typically 90% or more, of the top filler volume concentration. In further explanation, the total volume percentage of the fillers (e.g., carbon black and transparent filler) is represented by "A", and the Top Filler Volume Concentration, TFVC (total volume percentage of the fillers with resin filling the void volume of the fillers) is represented by "B", then A/B typically is greater than about 80%, (more typically A/B>90%).

While not being bound by any theory, it is presently believed that the light absorber (e.g., carbon black) in the photothermal conversion layer absorbs the laser energy that is irradiated through the transparent support and converts it into heat, which decomposes the matrix-resin and generates gas or voids. As a result, the voids separate this layer into parts such as two layers, and then the semiconductor wafer is released from the support. The surface separated by the voids can re-contact the surfaces, given time. The surface has carbon black particles as well as residual resin, which resin is reduced in molecular weight by thermal decomposition. In re-contacting (e.g., re-adhering), this residual resin can increase adhesion. On the other hand, when not only the photothermal conversion layer but also the adhesive layer is soft, the re-contacting area can be relatively large, which makes the adhesion larger and makes it very difficult to release the ultra-thinned wafer from the support without damage or breaking. In this invention, by setting A/B>80%, typically A/B>90%, the residual resin on the release surface is reduced. Thereby the adhesion generated by re-contacting can be minimized. Further, by raising the amount of carbon black together with using the transparent filler to meet A/B>80%, or 90%, the thickness desired for the photothermal conversion layer at least can be kept, and simultaneously UV transparency such as is desired when the adhesive layer is of the UV cure type. Thus, with the total amount in this range, the substrate with the thermoplastic priming layer and the support are easily separated after irradiation.

The thickness of the photothermal conversion layer can be around 0.5 µm. If the thickness is too small, partial exposure of the adjacent adhesive layer to release surface can occur, which can raise adhesion of the release surface especially when the adhesive layer is relatively soft, and this can result in difficult removable (without breakage) of the ultra-thinned wafer.

The photothermal conversion layer may contain other additives, if desired. For example, in the case of forming the layer by coating a heat decomposable resin in the form of a monomer or an oligomer and thereafter polymerizing or curing the resin, the layer may contain a photo-polymerization initiator. Also, the addition of a coupling agent (integral blend method, i.e., the coupling agent is used as an additive in the formulation rather than as a pre-surface-treatment agent) for increasing the adhesive force between the glass and the photothermal conversion layer, and the addition of a crosslinking agent for improving the chemical resistance are effective for their respective purposes. Furthermore, in order to promote the separation by the decomposition of the photothermal conversion layer, a low-temperature gas generator may be contained. Representative examples of the low-temperature gas generator which can be used include a foaming agent and a sublimating agent. Examples of the foaming agent include sodium hydrogen carbonate, ammonium carbonate, ammonium hydrogen carbonate, zinc carbonate, azodicarbonamide, azobisisobutylonitrile, N,N'-dinitrosopentamethylenetetramine, p-toluenesulfonylhydrazine and p,p-oxybis(benzenesulfonylhydrazide). Examples of the sublimating agent include 2-diazo-5,5-dimethylcyclohexane-1,3-dione, camphor, naphthalene, borneol, butyramide, valeramide, 4-tert-butylphenol, furan-2-carboxylic acid, succinic anhydride, 1-adamantanol and 2-adamantanone.

The photothermal conversion layer can be formed by mixing the light-absorbing agent such as carbon black, the heat decomposable resin and a solvent to prepare a precursor coating solution, coating this solution on the support, and drying it. Also, the photothermal conversion layer can be formed by mixing the light-absorbing agent, a monomer or an oligomer as a precursor material for the heat decomposable resin and, optionally, additives such as photo-polymerization initiator, and a solvent, if desired, to prepare a precursor coating solution in place of the heat decomposable resin solution, coating the solution on the support, drying and polymerizing/curing it. For coating the solution on the support, a general coating method suitable for coating on a hard support, such as spin coating, die coating, and roll coating, can be used. In the case of forming the photothermal conversion layer in a double-faced tape, the photothermal conversion layer can be formed on a film by using a coating method such as die coating, gravure coating, and knife coating.

In general, the thickness of the photothermal conversion layer is not limited as long as it permits the separation of the support and the substrate with the thermosetting priming layer, but it is typically 0.1 µm or more. If the thickness is less than 0.1 µm, the concentration of the light-absorbing agent required for sufficient light absorption becomes high and this deteriorates the film-forming property, and as a result, adhesion to the adjacent layer may fail. On the other hand, if the thickness of the photothermal conversion layer is 5 µm or more while keeping constant the concentration of the light-absorbing agent required permitting the separation by the thermal decomposition of the photothermal conversion layer, the light transmittance of the photothermal conversion layer (or a precursor thereof) becomes low.

The provided laminate body has a joining layer disposed upon the latent release layer. The joining layer is a material that is located between and in contact with the latent release layer and a thermoplastic priming layer. The joining layer adheres to both the latent release layer and the thermoplastic priming layer and is typically an adhesive. The joining layer can be a thermoplastic material such as an epoxy, polyester, polyimide, polycarbonate, polyurethane, polyether, or natural or synthetic rubber. The joining layer may or may not be cross-linked or cross-linkable. The joining layer can also be a thermosetting material such as a curable polymer or adhesive. Examples of adhesives which can be used as the joining layer in the provided laminate invention include rubber-base adhesives obtained by dissolving rubber, elastomer or the like in a solvent, one-part thermosetting adhesives based on epoxy, urethane or the like, two-part thermosetting adhesives based on epoxy, urethane, acryl or the like, hot-melt adhesives, ultraviolet (UV)- or electron beam-curable adhesives based on acryl, epoxy or the like, and water dispersion-type adhesives. UV-curable adhesives obtained by adding a photo-polymerization initiator and, if desired, additives to (1) an oligomer having a polymerizable vinyl group, such as urethane acrylate, epoxy acrylate or polyester acrylate, and/or (2) an acrylic or methacrylic monomer are suitably used. In some embodiments, the joining layer can comprise a curable (meth)acrylate polymer. Examples of additives include a thickening agent, a plasticizer, a dispersant, filler, a fire retardant and a heat stabilizing agent.

In embodiments wherein the provided laminate further comprises a substrate in contact with the thermoplastic priming layer, the substrate can be, for example, a brittle material difficult to thin by conventional methods. Examples thereof include semiconductor wafers such as silicon and gallium arsenide, a rock crystal wafer, sapphire and glass. The substrate to be ground can have a circuit side and a backside. The surface side can include circuit elements such as traces, integrated circuits, electronic components, and conductivity connectors such as, for example, solder balls or bumps. Other electrically-connecting devices such as pins, sockets, electrical pads, can also be included on the circuit side.

The joining layer can be used for fixing the substrate to be ground to the support through a photothermal conversion layer. After the separation of the substrate and the support by the decomposition of the photothermal conversion layer, a substrate having the joining layer thereon is obtained. Therefore, the joining layer must be easily separated from the substrate, such as by peeling. Thus, the joining layer has an adhesive strength high enough to fix the substrate to the support yet low enough to permit separation from the substrate. Examples of the adhesive which can be used as the joining layer in the present invention include rubber-base adhesives obtained by dissolving rubber, elastomer or the like in a solvent, one-part thermosetting adhesives based on epoxy, urethane or the like, two-part thermosetting adhesives based on epoxy, urethane, acryl or the like, hot-melt adhesives, ultraviolet (UV)- or electron beam-curable adhesives based on acryl, epoxy or the like, and water dispersion-type adhesives. UV-curable adhesives obtained by adding a photopolymerization initiator and, if desired, additives to (1) an oligomer having a polymerizable vinyl group, such as urethane acrylate, epoxy acrylate or polyester acrylate, and/or (2) an acrylic or methacrylic monomer are suitably used.

In addition to the curable (meth)acrylate polymer, the curable (meth)acrylate adhesion modifying agent and the photoinitiator, the joining layer can also include, for example, reactive diluents. The adhesive joining layer can include, for example, a reactive diluent in an amount between the range of about 10% and about 70% by weight. Reactive diluents can be used to adjust viscosity and/or physical properties of the cured composition. Examples of suitable reactive diluents include mono- and polyfunctional (meth)acrylate monomers (e.g., ethylene glycol di(meth)acrylate, hexanediol di(meth) acrylate, triethylene glycol di(meth)acrylate, trimethylolpropane tri(meth)acrylate, tripropylene glycol di(meth)acrylate, tetrahydrofurfuryl (meth)acrylate, phenoxyethylacrylate), vinyl ethers (e.g., butyl vinyl ether), vinyl esters (e.g., vinyl acetate), and styrenic monomers (e.g., styrene).

The substrate to be processed can be a semiconductor wafer such as a silicon wafer that generally can have asperities such as circuit patterns on one side. For the joining layer to fill in the asperities of the substrate to be ground and rendering the thickness of the joining layer uniform, the adhesive used for the joining layer is typically in a liquid state during coating and laminating and typically has a viscosity of less than 10,000 centipoises (cps) at the temperature (for example, 25° C.) of the coating and laminating operations. This liquid adhesive is typically coated by a spin coating method among various methods described later. A UV-curable adhesive or a visible light-curable adhesive are typically used which can enable the thickness of the joining layer to be made uniform and moreover, the processing speed to be high for the above-mentioned reason.

The storage modulus of the adhesive can typically be 100 megaPascals (MPa) or more at 25° C. and 10 MPa or more at 50° C. under the use conditions after removal of the solvent of the adhesive in the case of a solvent-type adhesive, after curing in the case of a curable adhesive, or after normal temperature solidification in the case of a hot-melt adhesive. With this elastic modulus, the substrate to be ground can be prevented from warping or distorting due to stress imposed during grinding and can be uniformly ground to an ultrathin substrate. The storage modulus or elastic modulus as used herein can, for example, be measured on an adhesive sample size of 22.7 mm×10 mm×50 μm in a tensile mode at a frequency of 1 Hz, a strain of 0.04% and a temperature ramp rate of 5° C./min. This storage modulus can be measured using SOLIDS ANALYZER RSA II (trade name) manufactured by Rheometrics, Inc.

When a photocurable adhesive is cured on the substrate to be ground, the storage modulus at a maximum achievable temperature at the interface of the substrate and the joining layer during grinding (usually from 40° C. to 70° C., for example 50° C.) is typically $9.0 \times 10^7$ Pa or more, more typically $3.0 \times 10^8$ Pa or more. With the storage modulus in this range, the pressing in the vertical direction by a grinding tool during the grinding is prevented from causing local deformation of the joining layer to an extent of damaging the substrate to be ground (silicon wafer). As an example of a photocurable adhesive that satisfies all of these conditions, is the adhesive disclosed in U.S. Ser. No. 13/249,501 (Larson et al.), entitled "Low Peel Adhesive", filed Sep. 30, 2011.

The thickness of the joining layer is not particularly limited as long as it can ensure the thickness uniformity required for the grinding of the substrate to be ground and the tear strength necessary for the peeling of the joining layer from the wafer after removing the support from the laminated body, and can sufficiently absorb the asperities on the substrate surface. The thickness of the joining layer is typically from about 10 to about 150 μm, typically from about 25 to about 100 μm.

When the joining layer comprises a curable (meth)acrylate polymer it can further include an amount of adhesion-modifying agent. The joining layer can include a curable (meth) acrylate adhesion-modifying agent in an amount greater than about 0.1% or an amount less than about 6.0% by weight. In some embodiments, the curable (meth)acrylate adhesion-modifying agent can be a silicone polymer substituted with at least one of (meth)acrylate group(s) or methacrylate group(s). Typically, the curable (meth)acrylate adhesion-modifying agent can be soluble in the curable (meth)acrylate polymer before curing. In addition, the viscosity of the combination of the curable (meth)acrylate adhesion-modifying agent and the curable (meth)acrylate polymer can be less than about 10,000 centipoises at ambient temperature and more preferably less than 5,000 centipoises. For example, the curable (meth)acrylate adhesion-modifying agent may be an (meth)acrylate modified silicone polymer, such as EBE-CRYL 350 from Cytec Industries (West Paterson, N.J.), CN9800 from Sartomer Company (Exton, Pa.), or TEGO RAD 2250, TEGO RAD 2500, TEGO RAD 2650, or TEGO RAD 2700 available from Evonik Industries (Essen, Germany).

The provided laminate bodies have a thermoplastic priming layer disposed upon the joining layer. The joining layer (typically an adhesive layer) is in contact with the thermoplastic priming layer. The thermoplastic priming layer provides a low or non-outgassing layer adjacent any substrate to which it contacts. The provided thermoplastic priming layer should be substantially inert (unreactive) to organic and inorganic substrate materials and can be stable to relatively high temperatures, for example 260° C. lead free reflow conditions. The thermoplastic priming layer should have high adhesion to both organic and inorganic substrate materials. In certain embodiments, the thermoplastic priming layer has a relatively high molecular weight, in order to obtain both a desirable melt viscosity and high stiffness at high temperatures.

The thermoplastic priming layer can also provide a common surface material for the thermosetting adhesive to contact instead of widely varying substrate surfaces depending on the source of the substrate and, if the substrate is a wafer that includes circuit elements, any circuit elements such as solder balls or bumps on the circuit side of the wafers. The thermoplastic priming layer can provide a layer that can be, optionally, filled with heat-absorbing (infrared (IR)-absorbing) material to protect the wafer surface from laser degradation during the delamination step. The thermoplastic priming layer can provide a solvent-soluble surface that is cleanable in bulk or as fine residues after the thermosetting joining layer is peeled off thus reducing or eliminating the potential for reside from the thermosetting joining layer. Finally, protection from solubilizing process chemistries used for removing the thermoplastic priming layer can be provided by edge removal and overcoating with chemically stable thermosetting joining layer material as shown in FIG. 2.

The thermoplastic priming layer can include any thermoplastic material that can be applied uniformly to the substrate surface and can withstand the process conditions of, for example, temperature, pressure (such as low pressure), solvent exposure, acid or base exposure required by the semiconductor manufacturing industry. Suitable methods for coating of the polyamide thermoplastic priming layer include, but are not limited to: spin coating, spray coating, dip coating, screen-printing, die coating, or knife coating. One particularly useful coating method is spin coating a solution of the thermoplastic primer material dissolved in solvent. Typical solvents include any solvent that will dissolve the polyamide thermoplastic priming layer, for example: methanol, ethanol, propanol, isopropanol, butanol, isobutanol, secondary butanol, tertiary butanol, pentanol, isopentanol, secondary pentanol, neopentanol, tertiary pentanol, hexanol, secondary hexanol, heptanol, secondary heptanol, octanol, 2-ethylhexanol, toluene, xylene, N,N-dimethylacetamide, N,N-dimethylformamide, N—N-methyl-2-pyrrolidone, dimethyl sulfoxide, propylene carbonate, 1,3-dioxolane, cyclohexanone, cyclopentanone, ethyl acetate, propyl acetate, butyl acetate, hexafluoroisopropanol, hexafluoroacetone, 1',1',1'-trifluorotoluene and combinations thereof. In some embodiments, up to about 10 weight percent water can be added in addition to the organic solvent. In particular, alcohol solvents such as butanol, pentanol and hexanol are useful.

In certain embodiments, the thermoplastic priming layer is removable using common solvents such as alcohols.

Exemplary materials suitable for the thermoplastic priming layer include, but are not limited to, polyamide polymers including the reaction product of at least one organic diacid component with at least one diamine component.

The acid component may also contain short-chain saturated aliphatic dicarboxylic acids containing about 3 to about 12 carbon atoms, such as, for example: propanedioic acid (malonic acid), butanedioic acid (succinic acid), pentanedioic acid (glutaric acid), hexanedioic acid (apidic acid), heptanedioic acid (pimelic acid), octanedioic acid (suberic acid), nonanedioic acid (azelaic acid), decanedioic acid (sebacic acid), undecanedioic acid, and dodecanedioic acid. The acid component may also contain aromatic dicarboxylic acids such as benzene-1,2-dicarboxylic acid (ortho-phthalic acid), benzene-1,3-dicarboxylic acid (isophthalic acid), and benzene-1,4-dicarboxylic acid (terephthalic acid). The acid component may also contain unsaturated dicarboxylic acids such as (Z)-butenedioic acid (maleic acid), (E)-butenedioic acid (fumaric acid), and pent-2-enedioic acid (glutaconic acid).

In some embodiments, thirty-six carbon (C36) dimer acids obtained by the dimerization of an unsaturated C18 acid such as oleic acid, linoleic acid and mixtures thereof (e.g. tall oil fatty acids) can be useful for the preparation of the polyamide polymer used for the thermoplastic priming layer. Processes for the production of dimer acids are well known to the art, and by way of illustration, reference may be had to U.S. Pat. Nos. 2,793,219, 2,955,121, and 5,807,968, which are herein incorporated by reference. Such dimer acids have as their principal component a C36 dicarboxylic acid and typically have an acid value in the range of between about 180 and about 215, saponification value in the range of between about 190 and about 205 and neutral equivalent of between about 265 to about 310. Dimer acids containing less than about 30% by weight by-product acids including monobasic acids, trimer acids or higher polymer acids can be particularly suitable for this invention. The dimer acids may also be hydrogenated prior to use and/or molecularly distilled or otherwise purified to increase the C36 dimer content to about 90% or more. Dimer acids suitable for use are any of the diacids under the PRIPOL trade designation from Croda International (Edison, N.J.). Examples of suitable, commercially available dimer acids include, but are not limited to: PRIPOL 1012, PRIPOL 1013, PRIPOL 1017, PRIPOL 1022 and PRIPOL 1027. Particularly suitable are the hydrogenated dimeracid molecules such as PRIPOL 1006, PRIPOL 1009, and PRIPOL 1025. Other suitable dimer acids are available from BASF (Florham Park, N.J.) under the trade designation EMPOL or from Arizona Chemical (Jacksonville, Fla.) under the trade designation UNIDYME.

In the preparation of polyamide polymers, mixtures of more than one diacid component may be used.

Suitable examples of diamines include, but are not limited to: ethanediamine, propanediamine, butanediamine, pentanediamine, hexanediamine, heptanediamine, octanediamine, nonanediamine, decanediamine, undecanediamine, dodecanediamine, any of the diamines sold under the PRIAMINE trade designation by Croda USA (Edison, N.J.), 1,4-bis(aminomethyl)cyclohexane, bis(4-aminocyclohexyl) methane, 1,3-di-(4-piperidino)propane, 1,2-diaminobenzene, 1,3-diaminobenzene, 1,4-diaminobenzene, p-xylylenediamine, m-xylylenediamine, o-xylylenediamine, piperazine, 4-aminoethylpiperazine, any of the polyoxyalkyleneamines available under the JEFFAMINE tradename from Huntsman Corp (Salt Lake City, Utah). In the preparation of polyamide polymers, mixtures of more than one diamine component may be used. During the manufacture of the provided laminated body, it can be important to prevent undesirable foreign substances such as air from entering between layers. For example, if air enters between layers, the thickness uniformity of the laminate is prevented and the substrate to be ground cannot be ground to a thin substrate. In the case of manufacturing laminated body 100 shown in FIG. 1, the following method, for example, may be considered. First, the precursor coating solution of photothermal conversion layer 110 can be coated on the light-transmitting support 112 by any one of the methods known in the art, dried and cured by irradiating with ultraviolet light or the like. Thereafter, the curable acrylate adhesive (thermosetting joining layer 108) can be coated on either one or both of the surface of cured photothermal conversion layer 110 and the surface of thermoplastic priming layer 106 which is disposed upon substrate 102 on the non-ground side or circuit side. Photothermal conversion layer 110 and thermoplastic priming layer 106/substrate 102 are attached through the curable acrylate adhesive, which is then cured to form thermosetting joining layer 108, for example, by irradiating with ultraviolet light from the support side, whereby a laminate can be formed. The formation of such a laminate is typically performed under vacuum to prevent air from entering between layers. This can be attained by, for example, modifying a vacuum adhesion device such as that described in U.S. Pat. No. 6,221,454 (Kazuta et al.)

The laminate body can be designed such that it is free from the invasion of water used during grinding of the substrate, if the substrate is a wafer, has an adhesive strength between layers so as not to cause dropping off of the substrate, and has an abrasion resistance so as to prevent the photothermal conversion layer from being abraded by the water flow (slurry) containing dusts of the ground substrate. A thinned substrate can be manufactured by the method comprising preparing a laminate formed as above, grinding the substrate, to a desired thickness, applying radiation energy to the photothermal conversion layer through the light-transmitting support to decompose the photothermal conversion layer and thereby to separate the ground substrate from the light-transmitting support, and peeling the joining layer from the substrate. The provided laminate body can be used for holding substrates for operations other than backside grinding. Other possible uses of the laminate body can include holding the substrate during coating, including vacuum coating, deposition, etching, stripping, chemically treating, annealing, polishing, stress relieving, bonding or attaching, optically measuring and electrically testing.

Figure 3A:
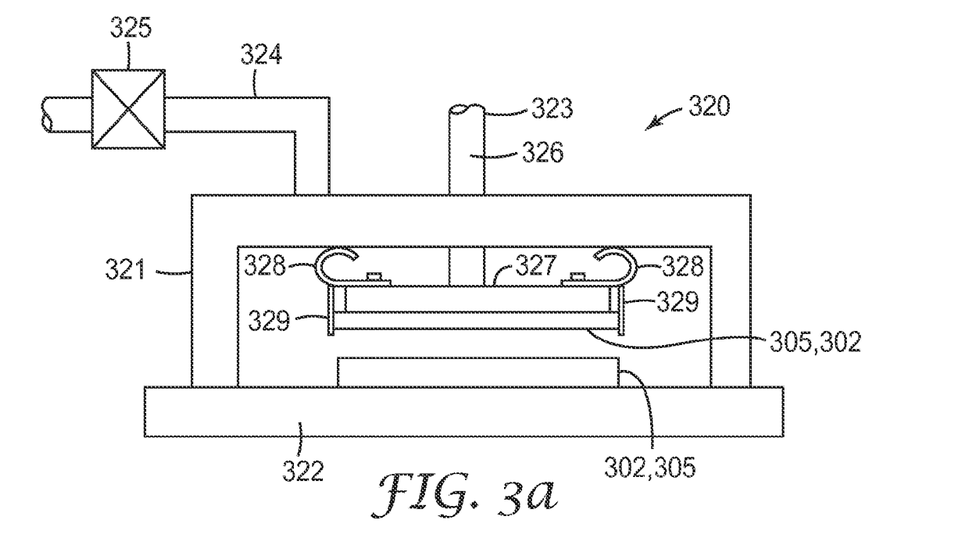
FIGS. 3a and 3b are cross-sectional views showing a vacuum adhesion device useful in the present disclosure.
Figure 3B:
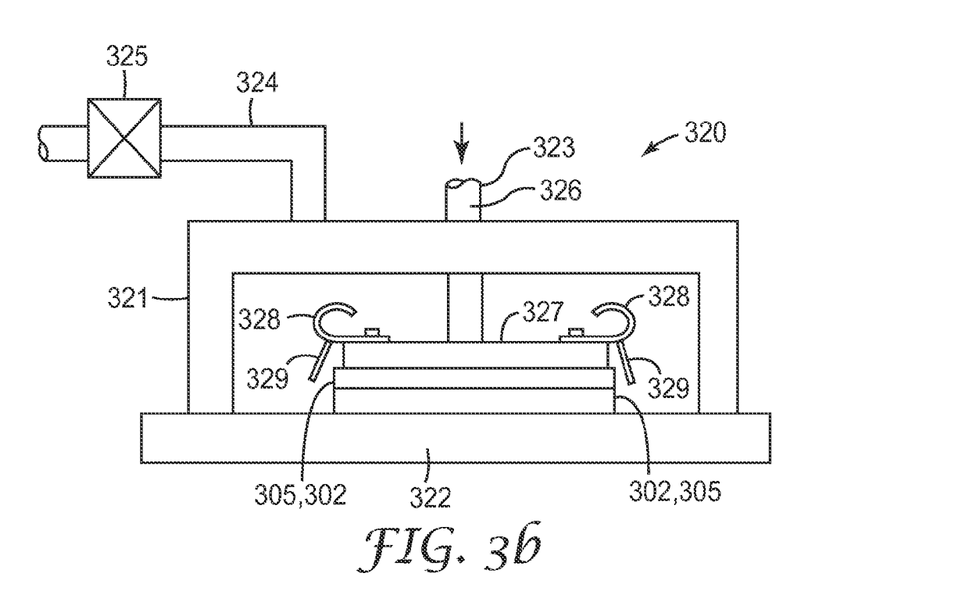

In one aspect, the method of the present disclosure is described below by referring to the drawings. In the following, a laser beam is used as the radiation energy source and a silicon wafer is used as the substrate to be ground, however, the present disclosure is not limited thereto. FIGS. 3a and 3b are cross-sectional views of a vacuum adhesion device suitable for the production of the laminate of one embodiment of the present disclosure. Vacuum adhesion device 320 comprises vacuum chamber 321; supporting part 322 provided in the vacuum chamber 321, on which either one of substrate 302 to be ground (silicon wafer) or support 305 is disposed; and holding/releasing means 323 provided in vacuum chamber 321 and movable in the vertical direction at the upper portion of supporting part 322, which holds the other one of support 305 or silicon wafer 302. Vacuum chamber 321 is connected to pressure reducing device 325 via pipe 324, so that the pressure inside vacuum chamber 321 can be reduced. Holding/releasing means 233 has shaft 326 movable up and down in the vertical direction, contact surface part 327 provided at the distal end of shaft 326, leaf springs 328 provided in the periphery of contact surface part 327, and holding claws 329 extending from each leaf spring 328. As shown in FIG. 3a, when leaf springs 328 are in contact with upper surface of the vacuum chamber 321, leaf springs 328 are compressed and holding claws 329 are directed toward the vertical direction to hold support 305 or wafer 302 at peripheral edges. On the other hand, as shown in FIG. 3b, when shaft 326 is pressed down and support 305 or wafer 302 is in close proximity to wafer 302 or support 305 respectively disposed on the supporting part, holding claws 329 are released together with leaf springs 328 to superimpose support 305 and wafer 302.

Using vacuum adhesion device 320, the provided laminated body can be manufactured as follows. First, as described above, a photothermal conversion layer is provided on support 305. Separately, a wafer to be layered is prepared. On either one or both of wafer 302 and the photothermal conversion layer of support 305, an adhesive for forming a joining layer is applied along with a thermoplastic priming layer (not shown). The thus-prepared support 305 and wafer 302 are disposed in vacuum chamber 321 of vacuum adhesion device 320 as shown in FIG. 3a, the pressure is reduced by the pressure reducing device, shaft 326 is pressed down to layer or laminate the wafer as shown in FIG. 3b and after opening to air, the adhesive is cured, if desired, to obtain the provided laminated body.

Figure 4A:
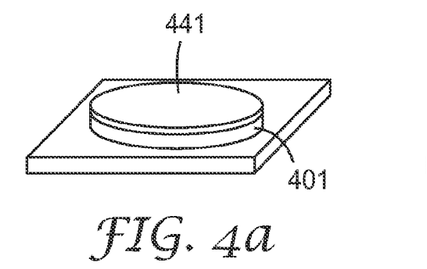
FIGS. 4a, 4a', 4b, 4c, 4d, and 4e are drawings showing the steps of separating the support and peeling the joining layer.
Figure 4B:
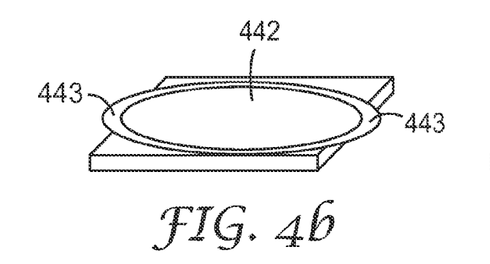
Figure 4C:
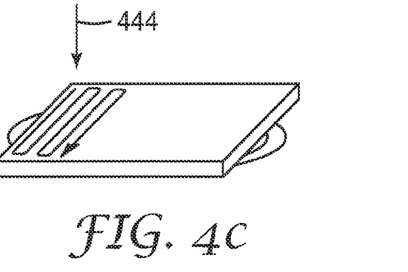
Figure 4D:
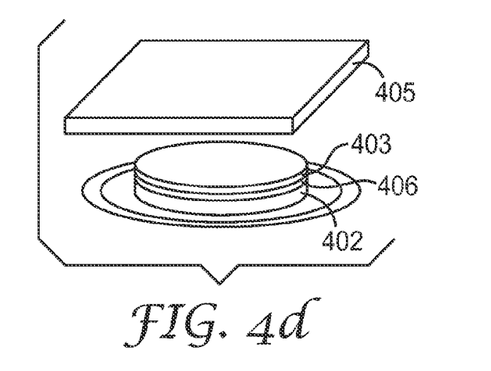
Figure 4E:
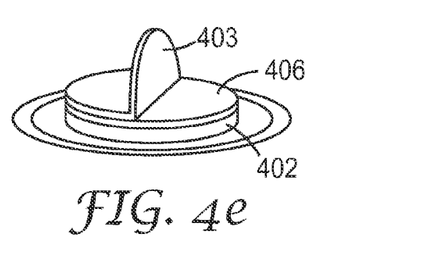

After grinding to the desired level, the laminated body is removed and conveyed to subsequent steps, where the separation of the wafer and the support by irradiation with a laser beam and the peeling of the joining layer from the wafer are performed. FIGS. 4a-4e are drawings of the steps of separating the support and peeling of the joining layer. First, by taking account of the final step of dicing, die bonding tape 441 is disposed, if desired, on the ground surface of the wafer side of laminated body 401 (FIG. 4a) or die bonding tape 441 is not disposed (FIG. 4a'), and thereafter, dicing tape 442 and dicing frame 443 are disposed (FIG. 4b). Subsequently, laser beam 444 irradiates the light-transmitting support side of the laminated body (FIG. 4c). After the irradiation of the laser beam, the support 405 is picked up to separate the support 405 from wafer 402 (FIG. 4d) and thermoplastic priming layer 406. Finally, joining layer 403 is separated by peeling to obtain a thinned silicon wafer 402 (FIG. 4e) having thermoplastic priming layer 406 disposed thereon. Thermoplastic priming layer 406 can be removed by solvent washing. A method and device useful for removing the thermoplastic priming layer is disclosed, for example, in unpublished Japanese Patent Application No. 2011-124375 (Saito) filed on Jun. 2, 2011 and entitled, "Method and Device for Cleaning Substrate".

Figure 5:
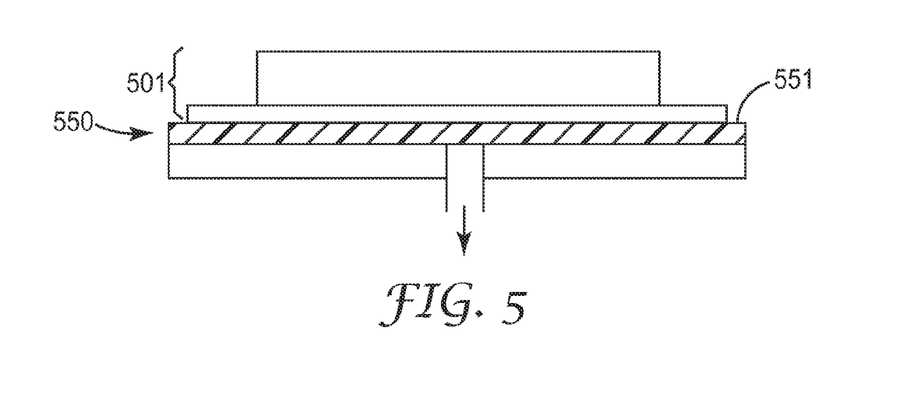
FIG. 5 is a cross-sectional view of a laminate fixing device which can be used in the laser beam irradiation step.

FIG. 5 is a cross-sectional view of a laminate fixing device which can be used, for example, in the step of irradiating, such as with a laser beam in one aspect of the disclosure. Laminated body 501 is mounted on fixing plate 551 such that the support comes as the upper surface with respect to fixing device 550. Fixing plate 551 is made of a porous metal such as sintered metal or a metal having surface roughness. The pressure is reduced from the lower part of fixing plate 551 by a vacuum device (not shown), whereby the laminated body 501 is fixed by suction onto fixing plate 551. The vacuum suction force is typically strong enough not to cause dropping in the subsequent steps of separating the support and peeling of the joining layer. A laser beam is used to irradiate the laminate fixed in this manner. For emitting the laser beam, a laser beam source having an output high enough to cause decomposition of the heat decomposable resin in the photothermal conversion layer at the wavelength of light absorbed by the photothermal conversion layer is selected, so that a decomposition gas can be generated and the support and the wafer can be separated. For example, a YAG laser (wavelength of 1,064 nm), a second harmonic YAG laser (wavelength: 532 nm) and a semiconductor laser (wavelength: from 780 to 1,300 nm) can be used.

Figure 6A:
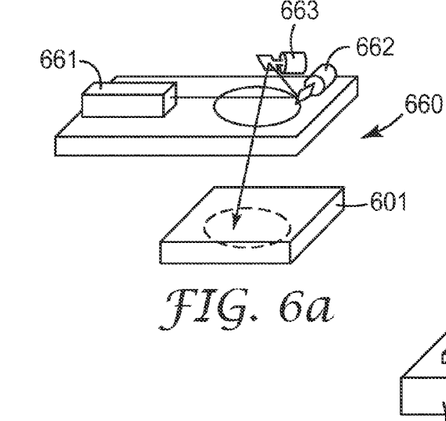
FIGS. 6a, 6b, 6c, 6d, 6e, and 6f are perspective views of a laser irradiation device.
Figure 6B:
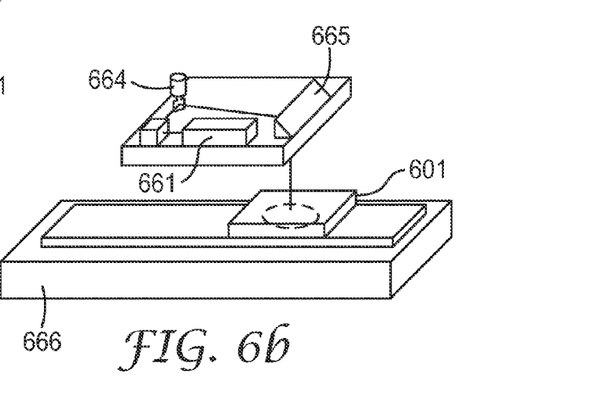
Figure 6C:
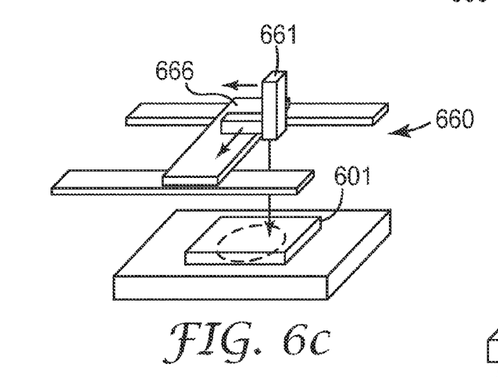
Figure 6D:
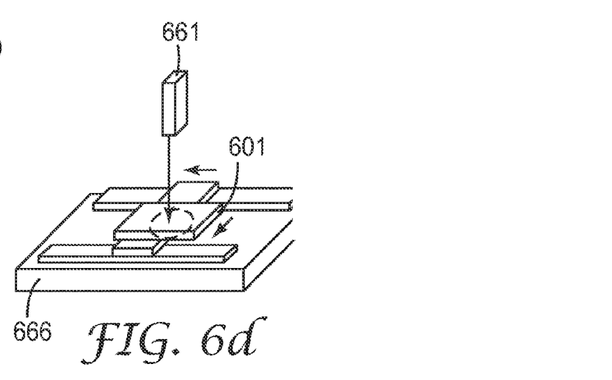
Figure 6E:
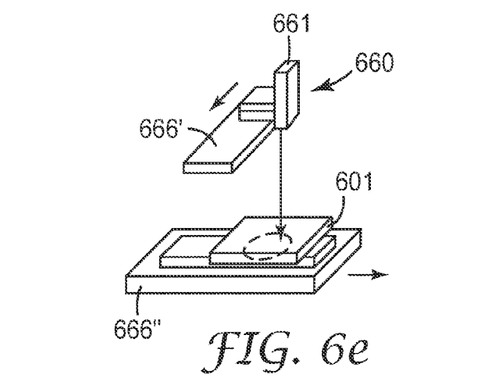

As the laser irradiation device, a device capable of scanning a laser beam to form a desired pattern on the irradiated surface and capable of setting the laser output and the beam moving speed is selected. Also, in order to stabilize the processing quality of the irradiated material (laminate), a device having a large focus depth is selected. The focus depth varies depending on the dimensional precision in the design of device and is not particularly limited but the focus depth is typically 30 µm or more. FIGS. 6a to 6f show perspective views of a laser irradiation device which can be used in the present disclosure. Laser irradiation device 660 of FIG. 6a is equipped with a galvanometer having a biaxial configuration composed of the X axis and the Y axis and is designed such that a laser beam oscillated from laser oscillator 661 is reflected by Y axis galvanometer 662, further reflected by X axis galvanometer 663 and the beam irradiates laminated body 601 which is disposed on the fixing plate. The irradiation position is determined by the directions of galvanometers 662 and 663. Laser irradiation device 660 of FIG. 6b is equipped with a uniaxial galvanometer or polygon mirror 664 and stage 666 movable in the direction orthogonal to the scanning direction. A laser beam from laser oscillator 661 is reflected by the galvanometer or polygon 664, further reflected by hold mirror 665 and the laser beam is directed upon laminated body 601 on movable stage 666. The irradiation position is determined by the direction of the galvanometer or polygon 664 and the position of movable stage 666. In the device shown in FIG. 6c, laser oscillator 661 is mounted on movable stage 666 which moves in the biaxial direction of X and Y, and a laser beam irradiates the entire surface of laminated body 601. The device of FIG. 6d comprises fixed laser oscillator 661 and movable stage 666 which moves in the biaxial direction of X and Y. The device of FIG. 6e has a constitution such that laser oscillator 661 is mounted on movable stage 666' which can move in the uniaxial direction and laminated body 601 is mounted on movable stage 666" which can move in the direction orthogonal to movable stage 666'.

Figure 6F:
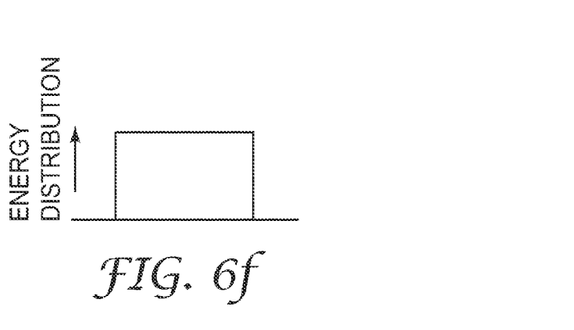

When there is concern about damaging the wafer of laminated body 601 by the laser irradiation, a top hat beam form (see FIG. 6f) having a steep energy distribution profile and reduced leakage energy to the adjacent region is typically formed. The beam form may be changed by any known method, for example, by (a) a method of deflecting the beam by an acousto-optic device, a method of forming a beam using refraction/diffraction, or (b) a method of cutting the broadening portion at both edges by using an aperture or a slit.

The laser irradiation energy is determined by the laser power, the beam scanning speed and the beam diameter. For example, the laser power that can be used is, but not limited to, from 0.3 watts (W) to 100 W, the scanning speed is from 0.1 meters/second (m/s) to 40 m/s, and the beam diameter is from 5 μm to 300 μm or more. In order to increase the speed of this step, the laser power is enhanced and thereby the scanning speed is increased. Since the number of scans can be further reduced as the beam diameter becomes larger, the beam diameter may be increased when the laser power is sufficiently high.

Figure 7A:
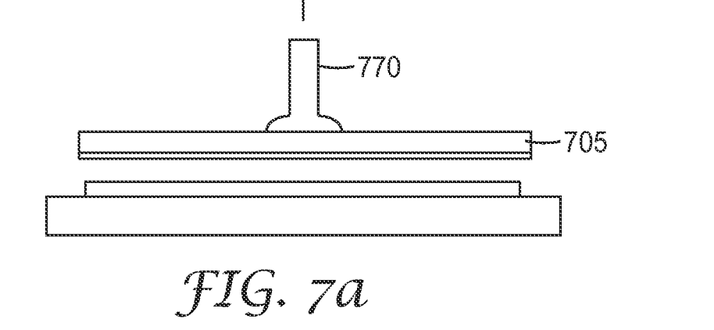
FIGS. 7a and 7b are schematic views of a pick-up used in the operation of separating wafer and support.
Figure 7B:
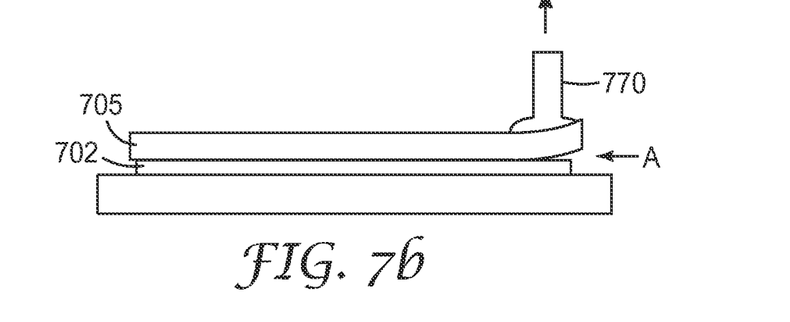

After the laser irradiation, the support is separated from the wafer and for this operation a general pick-up using a vacuum is used. The pick-up is a cylindrical member connected to a vacuum device having a suction device at the distal end. FIGS. 7a and 7b are schematic views of a pick-up useful in the separation operation of the wafer and the support. In the case of FIG. 7a, pick-up 770 is generally in the center of light-transmitting support 705 and picked up in a generally vertical direction, thereby peeling off the support. Also, as shown in FIG. 7b, pick-up 770 is at the edge part of light-transmitting support 705 and by peeling while blowing compressed air (A) from the side to enter air between wafer 702 and light-transmitting support 705, the support can be more easily peeled off.

Figure 8:
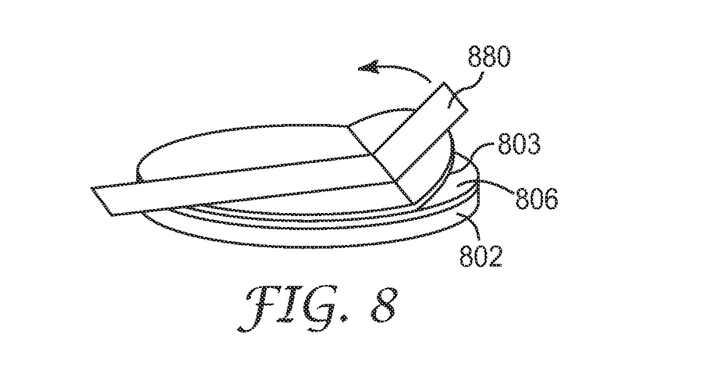
FIG. 8 is a schematic view showing how the joining layer is peeled from the wafer.

After removing the support, the joining layer on the wafer is removed. FIG. 8 is a schematic view showing how the joining layer can be peeled. For the removal of thermosetting joining layer 803, adhesive tape 880 can be used. Adhesive tape 880 can create a stronger adhesive bond with thermosetting joining layer 803 than the adhesive bond between thermoplastic primer layer 806 and joining layer. Such an adhesive tape 880 can be placed to adhere onto thermosetting joining layer 803 and then peeled in the arrow direction, whereby the thermosetting joining layer 803 is removed from primed substrate 802.

In a final step, the thermoplastic priming layer can be removed from the substrate by solvent washing. Typical solvents include any solvent that will dissolve the polyamide thermoplastic priming layer, for example, methanol, ethanol, propanol, isopropanol, butanol, isobutanol, secondary butanol, tertiary butanol, pentanol, isopentanol, secondary pentanol, neopentanol, tertiary pentanol, hexanol, secondary hexanol, heptanol, secondary heptanol, octanol, 2-ethylhexanol, toluene, xylene, N,N-dimethylacetamide, N,N-dimethylformamide, N—N-methyl-2-pyrrolidone, dimethyl sulfoxide, propylene carbonate, 1,3-dioxolane, cyclohexanone, cyclopentanone, ethyl acetate, propyl acetate, butyl acetate, hexafluoroisopropanol, hexafluoroacetone, 1',1',1'-trifluorotoluene and combinations thereof. In some embodiments, up to 10 wt. percent water can be added in addition to the organic solvent. In particular, alcohol solvents such as butanol, pentanol and hexanol are useful.

Finally, a thinned wafer remains in the state of being fixed to a dicing tape or a die frame with or without a die bonding tape. This wafer is diced in a usual manner, thereby completing a chip. However, the dicing may be performed before the laser irradiation. In such a case, it is also possible to perform the dicing step while leaving the wafer attached to the support, then subject only the diced region to the laser irradiation and separate the support only in the diced portion. The present disclosure may also be applied separately to a dicing step without using a dicing tape, by re-transferring through a joining layer the ground wafer onto a light-transmitting support having provided thereon a photothermal conversion layer.

The provided laminate body can be used for holding substrates while the substrates are being subjected to a process. Such processes can include, for example, backside grinding, coating, including vacuum coating, vapor deposition, etching, stripping, chemically treating, annealing, polishing, stress relieving, bonding or attaching, optically measuring and electrically testing. The contemplated processes can expose the substrate to a temperature of greater than about 150° C., greater than about 200° C., or even greater than about 300° C.

The methods disclosed herein allow the laminated body to be subjected to higher temperature processes than prior art methods. In the manufacture of semiconductor wafers, the instant method allows subsequent processing steps. One such exemplary processing step can be sputtering techniques such as, for example, metal deposition processing for electrical contacts. Another such exemplary processing step can be dry etching techniques such as, for example, reactive ion etching for creating vias in the substrate. Another such exemplary processing step can be thermo-compression bonding such as, for example, bonding an additional layer to the wafer. Embodiments of the disclosure are advantageous because the laminate can be subjected to these processing steps while still allowing the joining layer to be easily removed from the ground substrate (wafer). In some embodiments, the laminate comprising a cured adhesive joining layer can be subjected to temperatures of 200° C. and even 250° C. Embodiments of this disclosure provide that the adhesive can be heated to at least 250° C. for at least one hour and still maintain its mechanical integrity and adhesion while also able to be cleanly removed from a substrate.

In some embodiments, a thin thermoplastic priming layer can be applied on the circuit (on the backside) of the substrate to be processed, thermoplastic primer can be removed from the edge as shown in FIG. 2, and the primer can be dried. Subsequently, a bulk thermosetting joining layer can be applied by spin coating and curing this upon the primer layer.

The use of a thin thermoplastic priming layer provides a low or non-outgassing layer adjacent the wafer surface (circuit side) that is substantially inert (unreactive) to organic and inorganic wafer surface materials and is stable to relatively high temperatures, for example above 260° C. lead-free reflow. The thermoplastic priming layer can provide a common surface material for the thermosetting adhesive to contact instead of widely varying wafer surfaces depending on the source of the wafers and any circuit elements such as solder balls or bumps on the circuit side of the wafers. The thermoplastic priming layer can provide a layer that can be, optionally, filled with heat-absorbing (infrared (IR)-absorbing) material to protect the wafer surface from laser degradation during the delamination step. The thermoplastic priming layer can provide a solvent-soluble surface that is removable in bulk or as fine residues after the thermosetting joining layer is peeled off thus reducing or eliminating the potential for reside from the thermosetting joining layer. Finally, protection from solubilizing process chemistries used for removing the thermoplastic priming layer can be provided by edge removal and overcoating with chemically stable thermosetting joining layer material. In some embodiments, the thermoplastic priming layer can be coated onto the light-transmitting support, the thermosetting joining layer can then be applied to the thermoplastic priming layer, the latent release layer can be coated onto the substrate, and the coated support and substrate can be laminated together so that the latent release layer is laminated to the joining layer. Optionally the thermoplastic priming layer can be dried if the coating includes a solvent and optionally the joining layer can be cured before or after lamination.

The present disclosure is effective, for example, in the following applications.

1. Layered CSP (Chip Scale Package) for High-Density Packaging

The present disclosure is useful, for example, with a device form called system-in-package where a plurality of Large Scale Integrated (LSI) devices and passive parts are housed in a single package to realize multifunction or high performance, and is called a stacked multi-chip package. According to the present disclosure, a wafer of 25 μm or less can be reliably manufactured in a high yield for these devices.

2. Through-Type CSP Requiring High Function and High-Speed Processing

In this device, the chips are connected by a through electrode, whereby the wiring length is shortened and the electrical properties are improved. To solve technical problems, such as formation of a through hole for forming a through electrode and embedding of copper in the through hole, the chip may be further reduced in the thickness. In the case of sequentially forming chips having such a configuration by using the laminate of the present disclosure, an insulating film and a bump (electrode) may be formed on the back surface of the wafer and the laminate needs resistance against heat and chemicals. Even in this case, when the above-described support, photothermal conversion layer and joining layer are selected, the present disclosure can be effectively applied.

3. Thin Compound Semiconductor (e.g., GaAs) Improved in Heat Radiation Efficiency, Electrical Properties, and Stability Compound semiconductors such as gallium arsenide are being used for high-performance discrete chips, laser diode and the like because of their advantageous electrical properties (high electron mobility, direct transition-type band structure) over silicon. Using the laminate of the present disclosure and thereby reducing the thickness of the chip increases the heat dissipation efficiency thereof and improves performance. At present, the grinding operation for thickness reduction and the formation of an electrode are performed by joining a semiconductor wafer to a glass substrate as the support using a grease or a resist material. Therefore, the joining material may be dissolved by a solvent for separating the wafer from the glass substrate after the completion of processing. This is accompanied with problems that the separation requires more than several days time and the waste solution should be treated. These problems can be solved when the laminate of the present disclosure is used.

4. Application to Large Wafer for Improving Productivity

In the case of a large wafer (for example, a 12 inch-diameter silicon wafer), it is very important to separate the wafer and the support easily. The separation can be easily performed when the laminate of the present disclosure is used, and therefore, the present disclosure can be applied also to this field.

5. Thin Rock Crystal Wafer

In the field of rock crystal wafer, the thickness reduction of a wafer is required to increase the oscillation frequency. The separation can be easily performed when the laminate of the present disclosure is used, and therefore, the present disclosure can be applied also to this field.

6. Thin Glass for Liquid Crystal Display

In the field of liquid crystal display, the thickness reduction of the glass is desired to reduce the weight of the display and it is desired that the glass be uniform thickness. The separation can be easily performed when the laminate of the present disclosure is used, and therefore, the present disclosure can be applied also to this field.

Objects and advantages of this invention are further illustrated by the following examples, but the particular materials and amounts thereof recited in these examples, as well as other conditions and details, should not be construed to unduly limit this invention.

EXAMPLES

Test Method

Peel Force Measurements

Peel force measurements, to determine the peel force between a thermoplastic primer coating and a silicon wafer, were conducted by first coating a silicon wafer with the thermoplastic primer and drying the primer in an oven ramped to 150° C. over a period of 45 minutes. Peel force measurements were made on an INSIGHT MATERIALS TESTING SYSTEM 30EL, 820.030-EL, having a 30 kN capacity available from MTS System Corp., Eden Prairie, Minn. A 50 mm cut in the adhesive was made near the edge of the wafer prior to laminating a piece of 2" wide WAFER DE-TAPING TAPE 3305, available from the 3M Company, St. Paul, Minn., over and in the direction perpendicular to the prior cut in the adhesive. The piece of tape was sized such that it extended from one edge of the wafer to about 50 mm beyond the opposite edge of the wafer. Two parallel cuts, about 25 mm apart, were made in the tape and underlying adhesive using a razor blade. The coupon was mounted in a mounting plate in the tensile tester's base plate fixture. The 50 mm tab of tape extending past the edge of the wafer was then attached to the upper fixture of the tensile testing machine. The fixture was connected to a vertical load cell such that a 90-degree peel test could be conducted at a rate of 125 mm/min.

Example 1

The polyamide for the thermoplastic primer of Example 1 was prepared according to the procedure described in U.S.

Pat. No. 3,377,303. About 506 grams of Pripol 1009 (Croda, New Castle, Del.), about 118 grams of sebacic acid (Hawkins, Inc., Roseville, Minn.) and about 129 grams of piperazine (BASF, Florham Park, N.J.) were mixed in a 1 L resin flask whose head was fitted with a mechanical overhead stirrer, a thermocouple and a distillation head fitted with a receiver. While constantly stirring the mixture, the temperature was ramped up to 225° C. over a period of 4 hours and was held at that temperature overnight with water by-product being collected during this time in the receiver. The temperature was then increased to 250° C. and a 35 mm Hg vacuum was introduced into the reactor for a period of 4 hours while the mixture was being stirred. The polyamide polymer was then drained onto a silicone release sheet, cooled to room temperature, and collected.

A solution of the polyamide polymer (described above) was prepared by combining about 20 g of the polyamide polymer and about 80 g of 1-pentanol (Aldrich Chemical, Milwaukee, Wis.) in a glass jar sealed with PTFE tape and placing on a mechanical shaking table (Eberbach Corp., Ann Arbor, Mich.) for seven days at room temperature. The mixture was heated at 70° C. in the Despatch process oven (Model LFD1-42-3, Despatch Industries, Minneapolis, Minn.) for 15 minutes, then was hand-shaken, and was again heated at 70° C. for another 10 minutes. The resulting solution was filtered using a 25 mm ACRODISC syringe filter with 1.2 micron VERSAPOR membrane (part number 4488T from Pall Corporation, Port Washington, N.Y.).

Approximately 8 grams of the polyamide solution was poured on the polished side of a 150 mm×680 µm bare silicon wafer and deposited by spin coating at 3000 rpm for 30 seconds with an acceleration of 10,000 rpm/second (Cost Effective Equipment, a division of Brewer Science, Incorporated, Rolla, Mo.), followed by drying in a Despatch process oven (Model LFD1-42-3, Despatch Industries, Minneapolis, Minn.) by ramping from room temperature to 150° C. over 60 minutes. A second coating with the same solution, spin conditions, and oven-drying procedure was spin coated onto each wafer.

Comparative Example A

A polysulfone solution was prepared by combining about 15 g of Udel P-3703 NT11 (Solvay Specialty Plastics, Houston, Tex.) and about 85 g cyclohexanone (Aldrich Chemical Co. Milwaukee Wis.) in a glass jar sealed with a cap and PTFE tape, and placing on a mechanical shaking table (Eberbach Corp., Ann Arbor, Mich.) for one day at room temperature. The resulting solution was used as prepared.

Approximately 8 grams of the polysulfone solution was poured on the polished side of a 150 mm×680 µm bare silicon wafer, and deposited by spin coating at 3000 rpm for 30 seconds with an acceleration of 10,000 rpm/second (Cost Effective Equipment, a division of Brewer Science, Incorporated, Rolla, Mo.), followed by drying in a Despatch process oven (Model LFD1-42-3, Despatch Industries, Minneapolis, Minn.) by ramping from room temperature to 150° C. over 60 minutes. A second coating with the same solution, spin conditions, and oven-drying procedure was spin coated onto each wafer.

Comparative Example B

A polyimide solution was prepared by combining about 7.5 g of ULTEM 1000-1000 (Sabic Innovative Plastics, Houston, Tex.) and about 42.5 g of 1,3-dioxolane (Alfa-Aesar, Ward Hill, Mass.) in a glass jar sealed with a cap and PTFE tape, and placing on a mechanical shaking table (Eberbach Corp., Ann Arbor, Mich.) for one day at room temperature. The resulting solution was used as prepared.

Approximately 8 grams of the polyimide solution was poured on the polished side of a 150 mm x 680 µm bare silicon wafer, and deposited by spin coating at 3000 rpm for 30 seconds with an acceleration of 10,000 rpm/second (Cost Effective Equipment, a division of Brewer Science, Incorporated, Rolla, Mo.), followed by drying in a Despatch process oven (Model LFD1-42-3, Despatch Industries, Minneapolis, Minn.) by ramping from room temperature to 150° C. over 60 minutes. A second coating with the same solution, spin conditions, and oven-drying procedure was spin coated onto each wafer.

Results

| Sample | Peel Force (N/25 mm) |
| --- | --- |
| Example 1 | 17.8 |
| Comparative Example A | 0.025 |
| Comparative Example B | 0.025 |

Example 2

The polyamide solution of Example 1 was applied to the polished side of a 150 mm diameter×0.7 mm thick silicon wafer using the following procedure. About 10 cm$^3$ of the solution was poured onto the wafer surface, and was uniformly coated out on the wafer via spin coating at 3000 rpm for 30 seconds with an acceleration of 10,000 rpm/second (Cost Effective Equipment, a division of Brewer Science, Incorporated, Rolla, Mo.), followed by drying in a Despatch process oven (Model LFD1-42-3, Despatch Industries, Minneapolis, Minn.) by ramping from room temperature to 150° C. over 60 minutes to give a dried polyamide thermoplastic priming layer having a thickness of about 3 microns on the wafer surface.

About 8 cm$^3$ of LC5200-F1035 light cured adhesive (available from 3M Company, St. Paul, Minn.) was applied to the dried thermoplastic polyamide thermoplastic priming layer surface of the wafer via a syringe. The adhesive was uniformly coated on the coupon via spin coating at 975 rpm for 25 seconds. The resulting adhesive coated wafer was bonded to a 151 mm diameter×0.7 mm thick glass support using a wafer support system bonder, model number WSS 8101M (available from Tazmo Co., LTD. Freemont, Calif.). The glass support included a photothermal conversion layer, JS-5000-0012-5 (available from Sumitomo 3M Ltd., Tokyo, Japan), less than 1 micron thick. The Adhesive Composition A adhesive was UV cured for 20 seconds using a 6 inch (15.2 cm) long Fusion Systems D bulb, 300 watt/inch.

The backside of the wafer coupon was then ground to a thickness of about 50 micron, using conventional techniques. The bonded wafer-support stack was heat aged at 200° C. for 180 minutes. No delamination of the wafer or glass support, or separation of the polyamide thermoplastic primer layer from the LC5200-F1035 adhesive layer was observed.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited in this disclosure are herein incorporated by reference in their entirety.

What is claimed is:

1. A laminated body comprising:
   a light-transmitting support;
   a latent release layer disposed upon the light-transmitting support;
   a joining layer disposed upon the latent release layer; and
   a polyamide thermoplastic priming layer disposed upon the joining layer.

2. A laminate according to claim 1, wherein said light-transmitting support comprises glass.

3. A laminate according to claim 1, wherein the latent release layer comprises a photothermal conversion layer.

4. A laminate according to claim 2, wherein the latent release layer is activated upon exposure to actinic radiation that is emitted from a laser or laser diode.

5. A laminate according to claim 3, wherein the photothermal conversion layer comprises a light-absorbing agent and a heat decomposable resin disposed adjacent the joining layer.

6. A laminate according to claim 5, wherein said light-absorbing agent comprises carbon black.

7. A laminate according to claim 1, wherein the joining layer comprises a thermosetting adhesive.

8. A laminate according to claim 7, wherein the thermosetting adhesive comprises an acrylic adhesive.

9. A laminate according to claim 1, further comprising a substrate in contact with the polyamide thermoplastic priming layer.

10. A laminate according to claim 9 wherein the substrate comprises a substrate to be ground that is a silicon wafer.

11. A method for manufacturing a laminate according to claim 1, the method comprising:
    coating the polyamide thermoplastic priming layer onto the substrate;
    optionally, drying the polyamide thermoplastic priming layer if the coating includes a solvent;
    coating the joining layer onto the polyamide thermoplastic priming layer;
    optionally, curing the joining layer;
    coating the latent release layer upon the light-transmitting support; and
    laminating the latent release layer to the joining layer.

12. A method for manufacturing a laminate according to claim 11 further comprising:
    processing the substrate;
    irradiating the photothermal conversion layer through the light-transmitting support to decompose the photothermal conversion layer and thereby to separate the substrate and the light-transmitting support;
    peeling the joining layer from said substrate; and
    removing the polyamide thermoplastic priming layer from the substrate.

13. A method for manufacturing a laminate according to claim 12, wherein removing the polyamide thermoplastic priming layer comprises washing the polyamide thermoplastic priming layer with solvent.

14. A method for manufacturing a laminate according to claim 1, the method comprising:
    coating the polyamide thermoplastic priming layer onto the light-transmitting support;
    optionally, drying the polyamide thermoplastic priming layer if the coating includes a solvent;
    coating the joining layer onto the polyamide thermoplastic priming layer;
    optionally, curing the joining layer;
    coating the latent release layer upon the substrate; and
    laminating the latent release layer to the joining layer.

15. A method for manufacturing a laminate according to claim 14 further comprising:
    processing the substrate;
    irradiating the photothermal conversion layer through the light-transmitting support to decompose the photothermal conversion layer and thereby to separate the substrate and the light-transmitting support;
    peeling the joining layer from said substrate; and
    removing the polyamide thermoplastic priming layer from the substrate.

16. A method for manufacturing a laminate according to claim 15, wherein removing the polyamide thermoplastic priming layer comprises washing the polyamide thermoplastic priming layer with solvent.

* * * * *